(12) United States Patent
    Chien

(10) Patent No.: US 9,780,041 B1
(45) Date of Patent: Oct. 3, 2017

(54) METHOD FOR MAKING EMI SHIELDING LAYER ON A PACKAGE

(71) Applicant: UNIVERSAL SCIENTIFIC INDUSTRIAL (SHANGHAI) CO., LTD., Shanghai (CN)

(72) Inventor: Pioneer Chien, Caotun Township, Nantou County (TW)

(73) Assignee: Universal Scientific Industrial (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 15/263,711

(22) Filed: Sep. 13, 2016

(30) Foreign Application Priority Data

May 25, 2016 (CN) .......................... 2016 1 0353315

(51) Int. Cl.
| | |
|---|---|
| H01L 21/50 | (2006.01) |
| H01L 23/552 | (2006.01) |
| H01L 21/683 | (2006.01) |
| H01L 21/285 | (2006.01) |
| H01L 21/3205 | (2006.01) |
| H01L 21/78 | (2006.01) |

(52) U.S. Cl.
CPC ........ *H01L 23/552* (2013.01); *H01L 21/2855* (2013.01); *H01L 21/32051* (2013.01); *H01L 21/6835* (2013.01); *H01L 21/78* (2013.01); *H01L 2221/68381* (2013.01)

(58) Field of Classification Search
CPC .............. H01L 23/552; H01L 21/2855; H01L 21/32051; H01L 21/6835
See application file for complete search history.

(56) References Cited

U.S. PATENT DOCUMENTS

| | | | |
|---|---|---|---|
| 2012/0070939 A1* | 3/2012 | Dunne .................. | H01L 21/563 438/110 |
| 2013/0241128 A1* | 9/2013 | Eda ....................... | B32B 37/003 269/21 |
| 2013/0264691 A1* | 10/2013 | Kamphuis ........... | H01L 21/4814 257/659 |
| 2017/0005042 A1* | 1/2017 | Chen ..................... | H01L 23/552 |

* cited by examiner

*Primary Examiner* — Kimberly Rizkallah
*Assistant Examiner* — Maria Ligai
(74) *Attorney, Agent, or Firm* — Muncy, Geissler, Olds & Lowe, P.C.

(57) ABSTRACT

A method for making EMI shielding layer on a package is disclosed to include the steps of: a) disposing a UV curable adhesive which can be thermally released on a light-transmissive substrate; b) placing the package on the UV curable adhesive in such a way that the UV curable adhesive adheres to and cover a surface of the package having solder pads; c) irradiating UV light toward the light-transmissive substrate to cure the UV curable adhesive; d) forming an EMI shielding layer on the package; and e) thermally releasing the UV curable adhesive.

10 Claims, 4 Drawing Sheets

METHOD FOR MAKING EMI SHIELDING LAYER ON A PACKAGE

BACKGROUND OF THE INVENTION

1. Field of the Invention

The present invention relates to EMI shielding technology, and more particularly, to a method for making an EMI shielding layer on a package, which prevents EMI shielding layer from peeling off or scratching.

2. Description of the Related Art

In a conventional SiP (System in package) module, the outer surface of the package is usually coated with an EMI shielding layer for shielding electromagnetic noises. However, in the conventional process of making the EMI shielding layer, multi-strip or multi-panel designs are usually adapted. At this time, adjacent packages may be connected to each other by the EMI shielding layer, so that an external force should be applied to separate each of the connected packages. When separating the packages, a part of the EMI shielding layer may be peeled off, or burrs and chips may be produced and adhered to the EMI shielding layer or the package, resulting in poor package appearance and shorting between the EMI shielding layer and the solder pads. Therefore, it is desirable to provide a method for making EMI shielding layer on a package, which can avoid producing burrs and chips during formation of the EMI shielding layer on the package.

SUMMARY OF THE INVENTION

The present invention has been accomplished under the circumstances in view. It is a main object of the present invention to provide a method for making EMI shielding layer on a package, which avoids producing burrs and chips, and prevents shorting between the EMI shielding layer and the solder pads.

To achieve this and other objects of the present invention, a method for making EMI shielding layer on a package is provided to have the following steps: step a) disposing a thermal releasable UV curable adhesive on a light-transmissive substrate; step b) placing the package on the UV curable adhesive in such a way that the UV curable adhesive adheres to a bottom surface of the package having solder pads to cover the solder pads; step c) irradiating UV light toward the light-transmissive substrate to cure the UV curable adhesive; step d) forming an EMI shielding layer on the package; step e) thermally releasing the UV curable adhesive.

Thus, the solder pads on the bottom surface of the package are covered by the UV curable adhesive, preventing shorting between the EMI shielding layer and the solder pads during formation of the EMI shielding layer on the package. Further, during the process of thermally releasing the UV curable adhesive, the UV curable adhesive will exert a force to the EMI shielding layer on a lateral side surface of the package. The force exerted to the EMI shielding layer is uniformly distributed and slowly generated, avoiding producing burrs and chips on the EMI shielding layer.

In one aspect, when the package is placed on the UV curable adhesive, the UV curable adhesive is also adhered to the lateral side surface near the bottom of the package. This measure can effectively prevent shorting between the EMI shielding layer and the solder pads during the formation of the EMI shielding layer.

In another aspect, the invention employs a sputtering process to form the EMI shielding layer. Further, the sputtering temperature is controlled at a temperature, e.g. 170° C., that is lower than the temperature in thermally releasing the UV curable adhesive, preventing the UV curable adhesive, which is originally aimed to cover the solder pads, from thermal releasing during the sputtering process.

In another aspect, in the step of thermally releasing the UV curable adhesive, it is optioned to place the package in a high temperature liquid, enabling the UV curable adhesive to be thermally expanded and thermally released from the package.

Other and further benefits, advantages and features of the present invention will be understood by reference to the following specification in conjunction with the accompanying drawings, in which like reference characters denote like elements of structure.

DETAILED DESCRIPTION OF THE INVENTION

Figure 1:
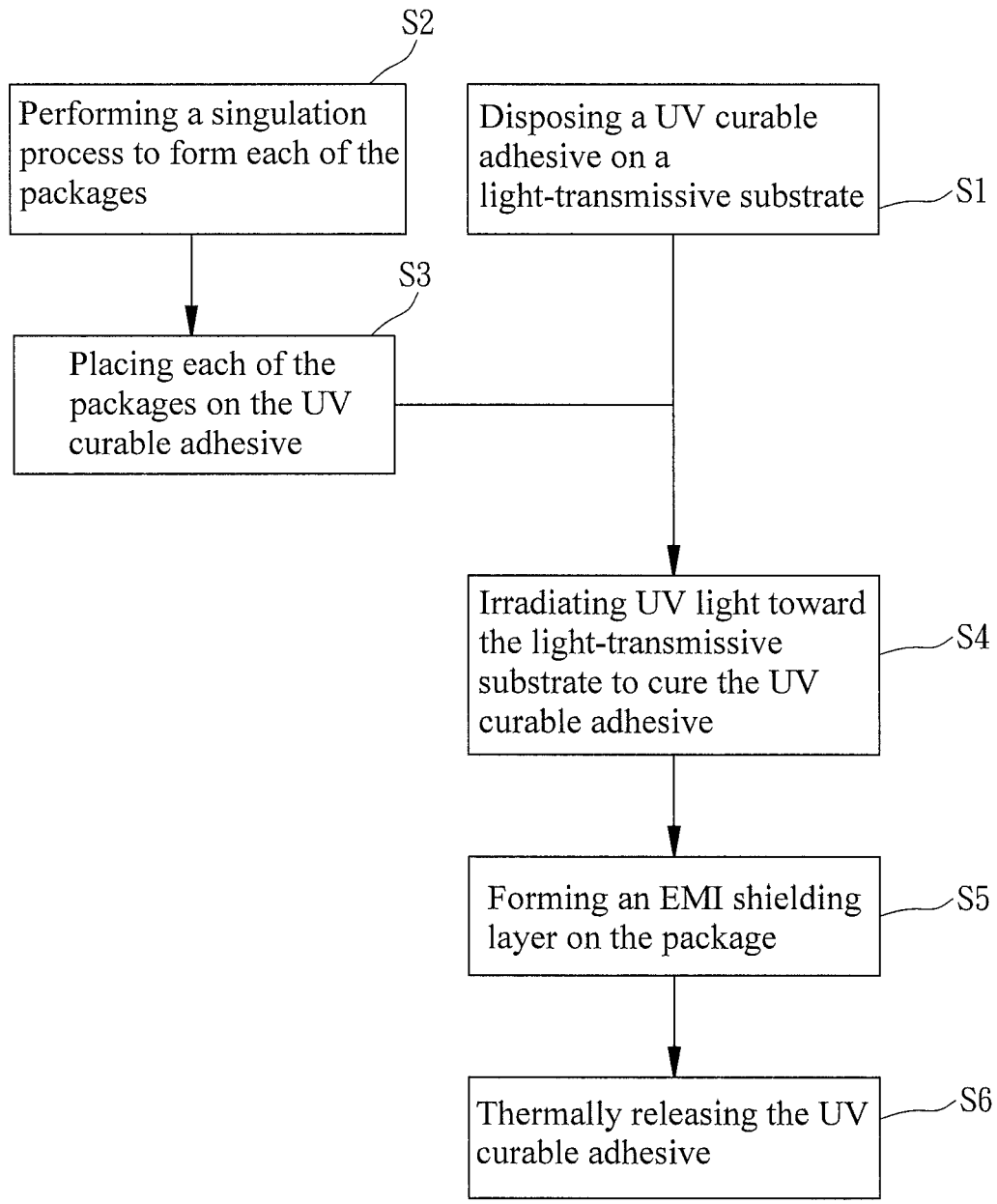
FIG. 1 is a flow chart of a method for making EMI shielding layer on a package in accordance with a preferred embodiment of the present invention.
Figure 2:
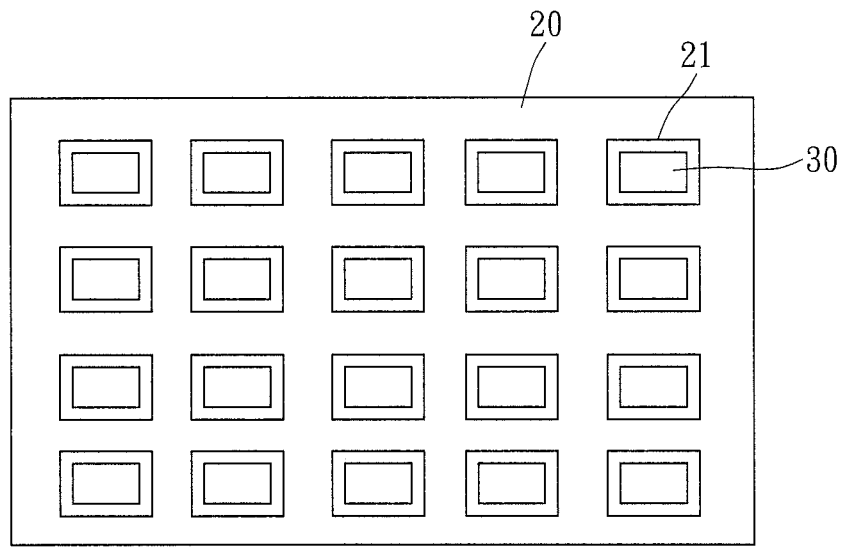
FIG. 2 is a top view of a light-transmissive substrate in accordance with the present invention, illustrating the distribution of the disposing zones.
Figure 3A:
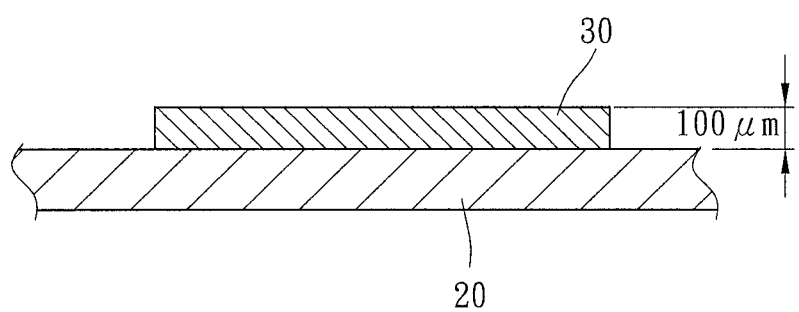
FIGS. 3A-3E are schematic sectional views illustrating the fabrication of the EMI shielding layer of the package in accordance with the present invention
Figure 3B:
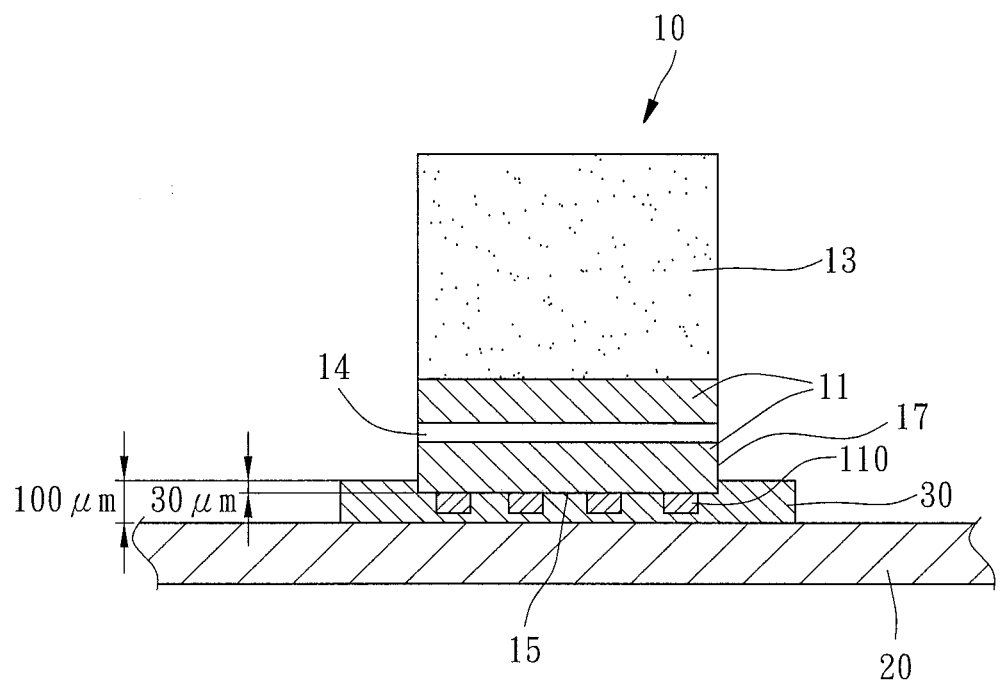
Figure 3C:
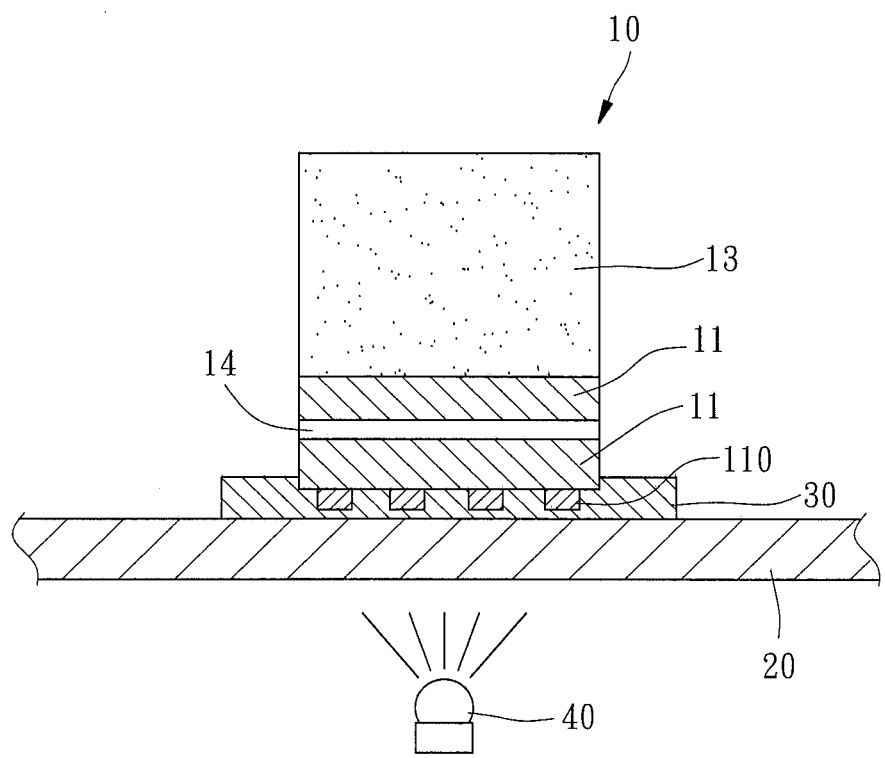

Referring to FIGS. 1-3, in order to facilitate understanding the benefits, advantages and features of the present invention, the invention provides a preferred embodiment in conjunction with the accompanying drawings, in which a package strip (or package panel, not shown) comprising a plurality of packages 10 of SiP (System in Package) module is used as an example. The SiP module can be, but not limited to, Fan out SiP or Embedded SiP. With respect to the structure of each package 10 of the package strip (or package panel), please refer to FIG. 3B. As illustrated, the package 10 comprises a substrate 11, and a molding layer 13 located on a top of the substrate 11. The substrate 11 has a grounding layer 14 and a plurality of solder pads 110 arranged on a bottom surface 15 thereof for enabling the package 10 electrically connected to external electronic devices. The details of each step are described hereinafter:

Step S1: Disposing a ultraviolet (abbreviated to UV hereafter) curable adhesive 30, which can be thermally released, on a top surface of a light-transmissive substrate 20 (see FIG. 3A). In this embodiment, a light-transmissive glass is used for the light-transmissive substrate 20. The light-transmissive substrate 20 herein called is a substrate 20 that at least admits UV light to transmit and propagate inside the substrate 20. Referring also to FIG. 2 and FIG. 3A, the top surface of the light-transmissive substrate 20 is divided into a plurality of disposing zones 21. These disposing zones 21 are arranged in, but not limited to, a 5×4 array. Each disposing zone 21 is evenly disposed with a layer of UV curable adhesive 30 having a thickness of 100 μm. The disposed area is larger than the area of the bottom surface 15 of the substrate 11. Further, in this embodiment, the UV curable adhesive 30 is selected from the product from VALTRON® company with the product model of AD4600 or AD4601 that can be cured within a few seconds after UV light exposure, and the UV curable adhesive 30 can be debonded, thermally expanded and then thermally released from the adhered object when placed in a hot liquid or in a high temperature environment over 170° C.

Further, in Step S2, Perform a singulation process to form the plurality of packages 10 from the package strip (or package panel).

Step S3: Use a pick and place machine to pick up each singulated package 10 and then place each singulated package 10 on the UV curable adhesive 30 to each respective coating zone 21, enabling the bottom surface 15 with the solder pads 110 of the package 10 to be completely adhered to and covered by the UV curable adhesive 30 (see FIG. 3B). Further, in the present embodiment, the UV curable adhesive 30 is adhered to the lateral side surface 17 near the bottom of the package 10 in a height of 30 μm from the bottom of the package 10, facilitating formation of the EMI shielding layer 50 on the package 10 in the follow-up steps to prevent from shorting and bridging between the EMI shielding layer 50 and the solder pads 110 of the package 10.

After step S3, Step S4 is performed. S4: Use a lamp 40 to irradiate UV light toward an surface of the light-transmissive substrate 20 which does not dispose the UV curable adhesive 30 to cure the UV curable adhesive 30 (see FIG. 3C). In this embodiment, the lamp 40 can be, but not limited to, mercury vapor bulb.

Figure 3D:
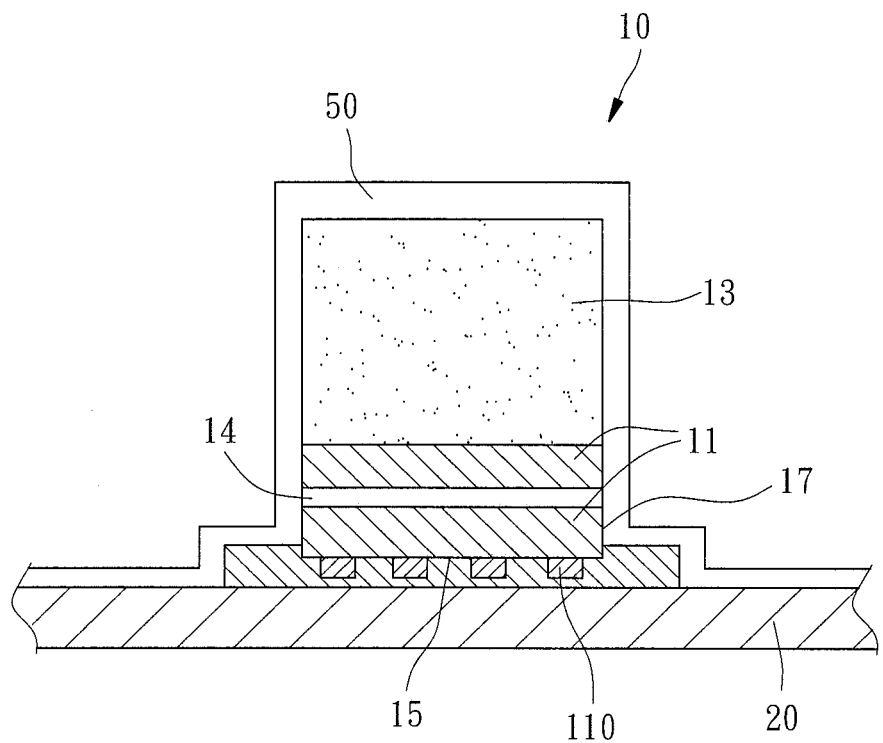

After step S4, Step S5 is performed. S5: Form an EMI shielding layer 50 on the package 10, enabling the EMI shielding layer 50 to be electrically connected with the grounding layer 14, as shown in FIG. 3D. In this embodiment, the EMI shielding layer 50 is formed by a sputtering process. In the sputtering process, the desired EMI shielding layer 50 is formed on an outer surface of the molding layer 13 of the package 10, the lateral side surface of the substrate 11 and a part of an outer surface of the UV curable adhesive 30. It is noted that the temperature in the sputtering process is controlled at about 170° C. that is lower than the temperature in thermally releasing the UV curable adhesive 30, preventing the UV curable adhesive 30, which is originally aimed to cover and shield the solder pads 110 of the package 10, from thermal releasing.

Figure 3E:
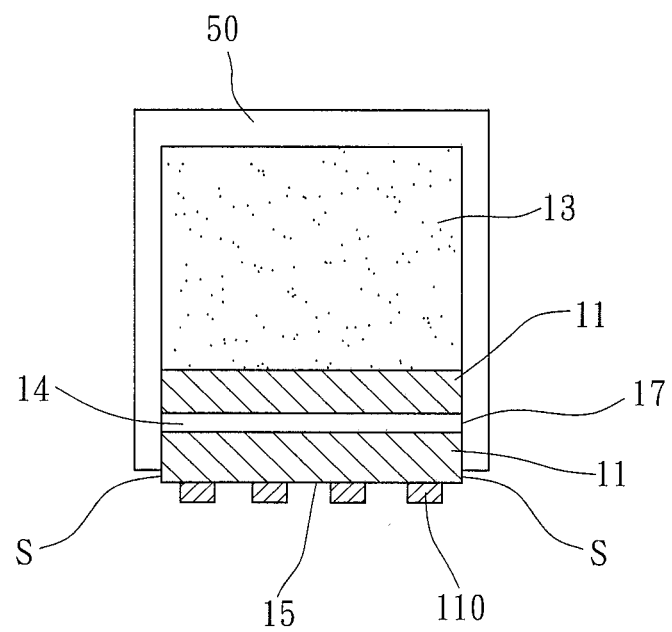

Thereafter, perform Step S6. S6: Thermally release the UV curable adhesive 30 by, for example, placing the package 10 which is covered by the UV curable adhesive 30 in a high temperature liquid for enabling the cured UV curable adhesive 30 to thermally release from the package 10. In this present embodiment, the package 10 covered by the UV curable adhesive 30 is placed in a high temperature liquid in a temperature higher than 170° C. for enabling the cured UV curable adhesive 30 to be thermally released from the package 10. At this moment, the UV curable adhesive 30 on the bottom surface 15 and the lateral side surface 17 near the bottom of the package 10 is thermally expanded and then peeled off from the package 10. During the thermal release process, the EMI shielding layer 50 close to the bottom of the lateral side surface 17 will also be disconnected due to the peeling of the UV curable adhesive 30, causing separation among the package 10, the UV curable adhesive 30 and the light-transmissive substrate 20. The separated package 10 is shown in FIG. 3E.

It is to be noted that, prior to Step S5 to form the EMI shielding layer 50, the UV curable adhesive 30 is cured to cover all of the bottom surface 15 (including the solder pads 110) of the package 10, preventing shorting and bridging between the EMI shielding layer 50 and the solder pads 110 in the follow up step of forming the EMI shielding layer 50.

Further, because the UV curable adhesive 30 is covered on the lateral side surface 17 near the bottom of the package 10 in Step S3, at least 30 μm height of the lateral side surface 17 from the bottom of the package 10 is not disposed with the EMI shielding layer 50. Thus, a clearance S is left between the bottom surface 15 of the package 10 and the EMI shielding layer 50 after Step S6, as show in FIG. 3E, effectively lowering the possibility of shorting and bridging between the EMI shielding layer 50 and the solder pads 110.

Further, in this embodiment, in step S6, the UV curable adhesive 30 is heated to expand in a high temperature liquid. The force exerted by the thermal expansion of the UV curable adhesive 30 on the EMI shielding layer 50 is uniformly distributed and slowly generated, avoiding producing burrs and chips.

What is claimed is:

1. A method for making EMI shielding layer on a package, comprising the steps of:
    a) disposing a UV curable adhesive on a light-transmissive substrate;
    b) placing said package on said UV curable adhesive in such a way that said UV curable adhesive adheres to a surface of said package having solder pads to cover the solder pads;
    c) irradiating UV light toward said light-transmissive substrate to cure said UV curable adhesive;
    d) forming an EMI shielding layer on said package; and
    e) thermally releasing said UV curable adhesive by placing the package in a high temperature liquid to thermal release the UV curable adhesive,
    wherein said high temperature liquid has a temperature higher than 170° C.

2. The method as claimed in claim 1, wherein in step d), the EMI shielding layer is formed by a sputtering process, and said UV curable adhesive is thermally released at a temperature higher than a temperature in said sputtering process.

3. The method as claimed in claim 2, wherein in step a), said light-transmissive substrate is a light-transmissive glass.

4. The method as claimed in claim 2, wherein, in step a), said UV curable adhesive disposed on said light-transmissive substrate has a thickness of 100 μm.

5. The method as claimed in claim 1, wherein in step a), said light-transmissive substrate is a light-transmissive glass.

6. The method as claimed in claim 1, wherein, in step a), said UV curable adhesive disposed on said light-transmissive substrate has a thickness of 100 μm.

7. The method as claimed in claim 1, wherein, in Step b), said UV curable adhesive is adhered to a lateral side surface near a bottom of said package.

8. The method as claimed in claim 7, wherein, in Step b), said UV curable adhesive is adhered to said lateral side surface in a height of 30 μm from the bottom of said package.

9. The method as claimed in claim 1, further comprising a sub step of performing a singulating process to a package strip that having a plurality of said packages to form a plurality of said packages prior to step b).

10. The method as claimed in any of claim 1, wherein a clearance is left between said bottom surface of said package and said EMI shielding layer.

* * * * *